(12) United States Patent
Hong et al.

(10) Patent No.: US 11,765,926 B2
(45) Date of Patent: Sep. 19, 2023

(54) THIN FILM ENCAPSULATION STRUCTURE AND METHOD FOR MANUFACTURING THE SAME

(71) Applicant: BOE TECHNOLOGY GROUP CO., LTD., Beijing (CN)

(72) Inventors: Rui Hong, Beijing (CN); Can Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 517 days.

(21) Appl. No.: 16/331,294

(22) PCT Filed: Sep. 12, 2018

(86) PCT No.: PCT/CN2018/105248
§ 371 (c)(1),
(2) Date: Mar. 7, 2019

(87) PCT Pub. No.: WO2019/062548
PCT Pub. Date: Apr. 4, 2019

(65) Prior Publication Data
US 2021/0336200 A1   Oct. 28, 2021

(30) Foreign Application Priority Data
Sep. 29, 2017   (CN) .......................... 201710906369.2

(51) Int. Cl.
*H10K 50/844*   (2023.01)
*H10K 71/00*   (2023.01)

(52) U.S. Cl.
CPC ........... *H10K 50/844* (2023.02); *H10K 71/00* (2023.02)

(58) Field of Classification Search
CPC ...... H01L 51/5253–5256; H01L 51/56; H10K 50/844; H10K 71/00
See application file for complete search history.

(56) References Cited

U.S. PATENT DOCUMENTS

| 2005/0110020 | A1 | 5/2005 | Hayashi et al. |
| 2012/0012988 | A1 | 1/2012 | Huang et al. |
| 2012/0133275 | A1 | 5/2012 | Lee et al. |
| 2013/0214266 | A1* | 8/2013 | Hirase ............... H05B 33/04 257/40 |

(Continued)

FOREIGN PATENT DOCUMENTS

| CN | 101295768 A | 10/2008 |
| CN | 105489786 A | 4/2016 |

(Continued)

OTHER PUBLICATIONS

PCT International Search Report, Application No. PCT/CN2018/105248, dated Dec. 6, 2018, 6 pages: with English translation.

(Continued)

*Primary Examiner* — Shaun M Campbell
(74) *Attorney, Agent, or Firm* — Armstrong Teasdale LLP

(57) ABSTRACT

Embodiments of the present disclosure provide a thin film encapsulation structure and a method for manufacturing the same. The thin film encapsulation structure includes a laminated layer for encapsulating a member to be encapsulated located on a substrate, the laminated layer including an organic layer and an inorganic layer alternately stacked, wherein an outermost layer of the laminated layer is the inorganic layer, the organic layer having an inner surface facing the member, an outer surface opposite to the inner surface, and an end surface located between the inner and outer surface and extending over a region, at a periphery of the member, of the substrate, a restriction layer, for positioning the organic layer, located between the end surface of the organic layer and a surface of the substrate, wherein the organic layer has one of hydrophilicity and hydrophobicity and the restriction layer has the other of hydrophilicity and hydrophobicity.

15 Claims, 4 Drawing Sheets

(56) References Cited

U.S. PATENT DOCUMENTS

| | | | | |
|---|---|---|---|---|
| 2014/0175397 | A1* | 6/2014 | Lee | H01L 51/5256 438/26 |
| 2015/0380683 | A1* | 12/2015 | You | H01L 51/56 438/26 |
| 2017/0207413 | A1* | 7/2017 | Li | H01L 51/5246 |
| 2017/0250365 | A1* | 8/2017 | Jin | H01L 51/56 |
| 2017/0279080 | A1* | 9/2017 | Wang | H01L 51/56 |
| 2018/0033998 | A1* | 2/2018 | Kim | H01L 27/3246 |
| 2018/0277609 | A1* | 9/2018 | Fukiwara | H01L 27/326 |

FOREIGN PATENT DOCUMENTS

| | | |
|---|---|---|
| CN | 105789257 A | 7/2016 |
| CN | 106024834 A | 10/2016 |
| CN | 207265104 U | 4/2018 |
| JP | 2005209412 A | 8/2005 |
| JP | 2005251721 A | 9/2005 |

OTHER PUBLICATIONS

PCT Written Opinion, Application No. PCT/CN2018/105248, dated Dec. 6, 2018, 6 pages.: with English translation of relevant part.
European Extended Search Report, Application No. 18849391.0, dated Oct. 22, 2021, 8 pps.
Japan Notice of Reasons of Refusal, Application No. 2019-548027, dated Jun. 3, 2022, 10 pps.: with English translation.
China First Office Action, Application No. 201710906369.2, dated May 31, 2023, 18 pps.: with English translation.

* cited by examiner

THIN FILM ENCAPSULATION STRUCTURE AND METHOD FOR MANUFACTURING THE SAME

CROSS REFERENCE TO RELATED APPLICATIONS

This patent application is a National Stage Entry of PCT/CN2018/105248 filed on Sep. 12, 2018, which claims the benefit and priority of Chinese Patent Application No. 201710906369.2 filed on Sep. 29, 2017, the disclosures of which are incorporated by reference herein in their entirety as part of the present application.

BACKGROUND

Embodiments of the present disclosure relate to the field of display panel encapsulation, and in particular, to a thin film encapsulation structure and a method for manufacturing the same.

Organic light emitting diode (OLED) display device, as a new type of light emitting device, has been increasingly applied to high performance display and has become the mainstream of the current display. Thin film encapsulation technology is extremely important for the manufacturing of OLED display devices, and is the most important in OLED technology. Thin film encapsulation technology is also widely used in OLEDs. Flexible OLEDs, micro-display OLEDs, and large size OLEDs all involve thin film encapsulation technology.

BRIEF DESCRIPTION

Embodiments of the present disclosure provide a thin film encapsulation structure and a method for manufacturing the same.

A first aspect of the embodiment of the present disclosure provides a thin film encapsulation structure. The thin film encapsulation structure includes a laminated layer for encapsulating a member to be encapsulated located on a substrate, the laminated layer including an organic layer and an inorganic layer alternately stacked, wherein an outermost layer of the laminated layer is the inorganic layer, the organic layer having an inner surface facing the member, an outer surface opposite to the inner surface, and an end surface located between the inner surface and the outer surface and extending over a region, at a periphery of the member, of the substrate, a restriction layer, for positioning the organic layer, located between the end surface of the organic layer and a surface of the substrate, wherein the organic layer has one of hydrophilicity and hydrophobicity and the restriction layer has the other of hydrophilicity and hydrophobicity.

In an embodiment of the present disclosure, the organic layer has hydrophilicity and the restriction layer has hydrophobicity.

In an embodiment of the present disclosure, a material of the organic layer includes epoxy resin, acryl, polyacrylate, polydimethyl diphenyl ether, polypropylene, or a combination thereof.

In an embodiment of the present disclosure, the organic layer has hydrophobicity and the restriction layer has hydrophilicity.

In an embodiment of the present disclosure, a material of the organic layer includes polyimide, polyethyleneimine, or a combination thereof, and a material of the restriction layer includes $Al_2O_3$.

In an embodiment of the present disclosure, the restriction layer has a thickness of about 50 to 800 Å, and the restriction layer has a width of about 100 to 500 μm.

In an embodiment of the present disclosure, a layer closest to the member of the laminated layer is the organic layer.

In an embodiment of the present disclosure, a layer closest to the member of the laminated layer is the inorganic layer.

In an embodiment of the present disclosure, the laminated layer further includes an auxiliary extension layer on a portion, extending along a direction parallel to a surface of the substrate, of the inner surface of the organic layer, wherein the auxiliary extension layer and the organic layer have hydrophilicity or hydrophobicity.

In an embodiment of the present disclosure, the auxiliary extension layer and the organic layer have hydrophilicity.

In an embodiment of the present disclosure, a material of the auxiliary extension layer includes $Al_2O_3$.

In an embodiment of the present disclosure, the auxiliary extension layer and the organic layer have hydrophobicity.

In an embodiment of the present disclosure, the auxiliary extension layer has a thickness of about 50 to 800 Å.

In an embodiment of the present disclosure, the inorganic layer includes a ceramic material.

In an embodiment of the present disclosure, the ceramic material includes $SiO_2$, $SiN_x$, $SiO_xN_y$, $Al_2O_3$, or a combination thereof.

A second aspect of an embodiment of the present disclosure provides a method for manufacturing a thin film encapsulation structure. The method includes providing a substrate, wherein a surface of the substrate is provided with a member to be encapsulated, forming a laminated layer, for encapsulating the member, on the substrate and the member, the laminated layer including an organic layer and an inorganic layer alternately stacked, wherein an outermost layer of the laminated layer is the inorganic layer, wherein forming the laminated layer further includes forming a restriction layer for positioning the organic layer on a surface, on which the organic layer is to be formed, of the substrate, the organic layer having one of hydrophilicity and hydrophobicity and the restriction layer has the other of hydrophilicity and hydrophobicity.

In an embodiment of the present disclosure, forming the laminated layer further includes forming the laminated layer further includes forming an auxiliary extension layer on a surface, on which the organic layer is to be formed, of the member or the inorganic layer before forming the organic layer, wherein the auxiliary extension layer and the organic layer have hydrophilicity or hydrophobicity.

Further aspects and regions of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Figure 1A:
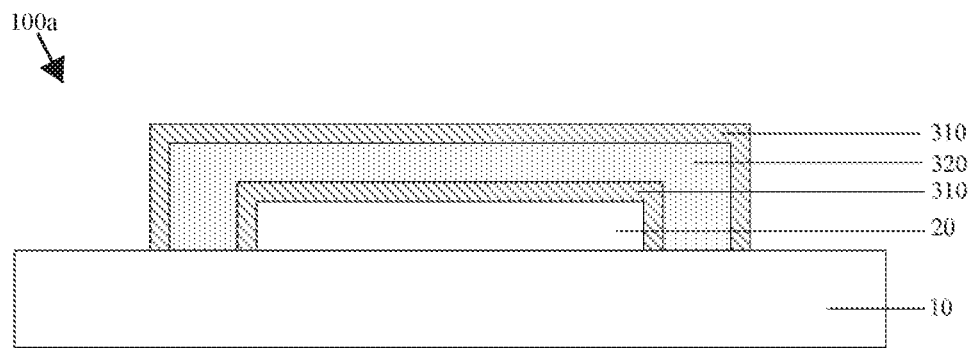
FIG. 1A is a schematic view showing a cross section of a thin film encapsulation structure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

In addition, it should be noted that, in the description of the present disclosure, the orientations or positions relationship indicated by the terms "upper", "above", "lower", "under", "top", "bottom", "between", etc. are the orientations or positions relationship based on the orientations or positions relationship shown in the drawings, which is merely for the convenience of describing the present disclosure and the simplifying the description, and does not indicate or imply that the referred device or element has to have a specific orientation and is constructed and operated in a specific orientation, therefore, it can not be understood as a limitation to the disclosure. In addition, when an element or a layer is referred to as being "on" another element or layer, the element or the layer can be directly on the another element or layer, or an intermediate element or layer can be present; likewise, when an element or a layer is referred to as being "under" another element or layer, the element or the layer can be directly under another element or layer, or at least one intermediate element or layer can be present; when an element or a layer is referred to as being between two elements or two layers, the element or the layer can be an unique element or layer between the two elements or the two layers, or more than one intermediate element or layer can be present.

The flow views depicted herein are just one example. There may be many variations to this view or the steps described therein without departing from the spirit of the disclosure. For instance, the steps may be performed in a differing order or steps may be added, deleted, or modified. All of these variations are considered a part of the claimed disclosure.

Example embodiments will now be described more fully with reference to the accompanying drawings.

Figure 1B:
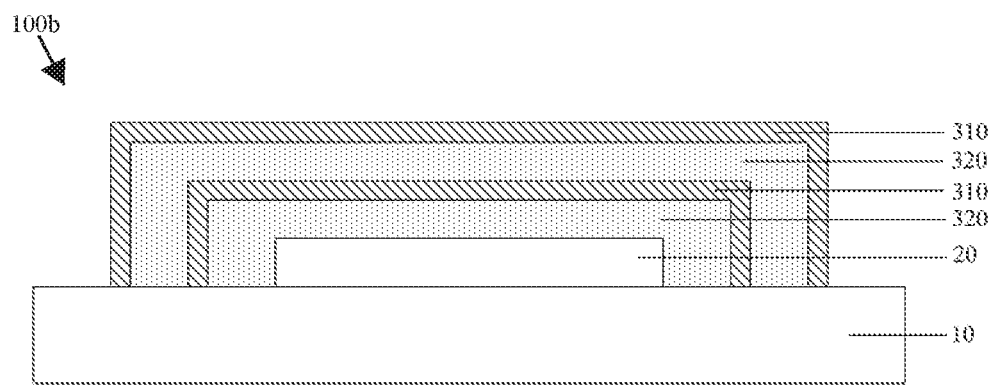
FIG. 1B is a schematic view showing a cross section of another thin film encapsulation structure.

FIG. 1A is a schematic view showing a cross section of a thin film encapsulation structure 100a. FIG. 1B is a schematic view showing a cross section of another thin film encapsulation structure 100b. As shown in FIGS. 1A and 1B, the thin film encapsulation structures 100a and 100b include a substrate 10, a member 20 to be encapsulated, an inorganic layer 310 and an organic layer 320 alternately stacked, respectively. A material of the organic layer 320 typically includes an ink material. Since the ink material (i.e., the organic layer 320) easily overflows in the peripheral region of the member 20 to be encapsulated, the ink material overflows the designed region and continuously spreads toward the edge of the substrate 10, thereby causing a wider frame after encapsulation.

In an embodiment of the present disclosure, a thin film encapsulation structure is provided. The thin film encapsulation structure is provided with a restriction layer in a peripheral region of a member to be encapsulated, which can prevent the organic layer material from overflowing the designed region, thereby contributing to a narrow frame encapsulation. In addition, the thin film encapsulation structure further includes an auxiliary extension layer on an inner surface of the organic layer facing the member to be encapsulated. The auxiliary extension layer contributes to uniformity of the organic layer when forming the organic layer, thereby avoiding formation of folds of the organic layer and improving the display effect of the display device.

Figure 2A:
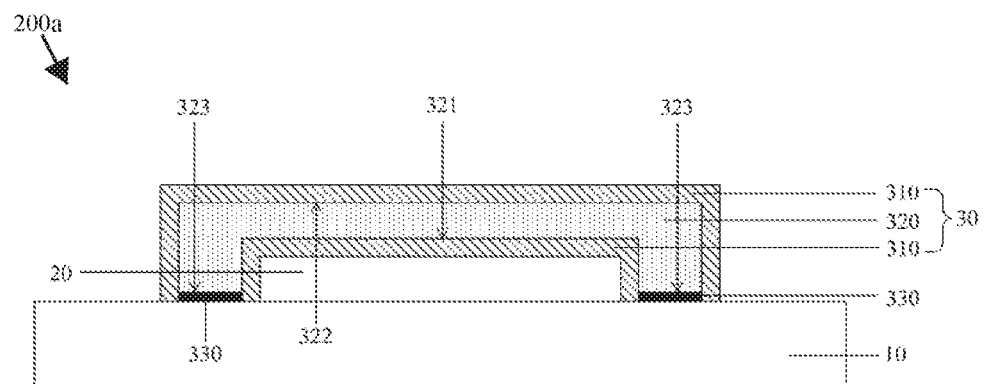
FIG. 2A is a schematic view showing a cross section of a thin film encapsulation structure according to an embodiment of the present disclosure.
Figure 2B:
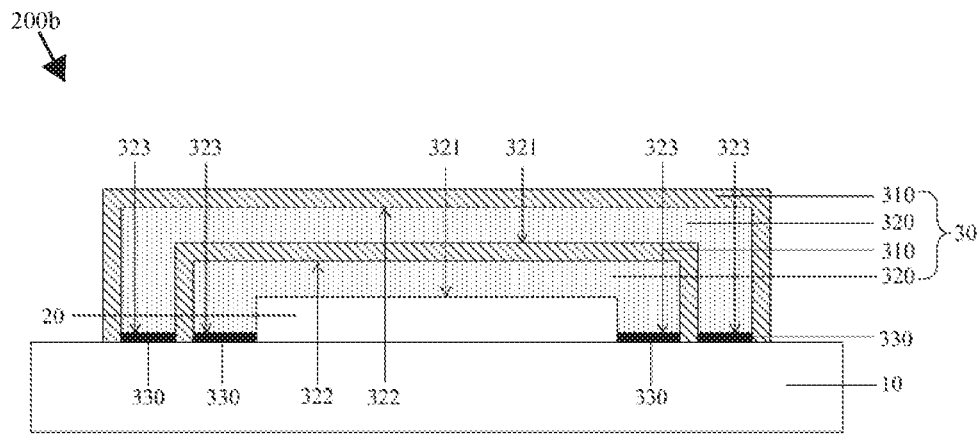
FIG. 2B is a schematic view showing a cross section of a thin film encapsulation structure according to an embodiment of the present disclosure.

FIG. 2A is a schematic view showing a cross section of a thin film encapsulation structure 200a according to an embodiment of the present disclosure. FIG. 2b is a schematic view showing a cross section of a thin film encapsulation structure 200b according to an embodiment of the present disclosure. As shown in FIGS. 2A and 2B, the thin film encapsulation structures 200a and 200b, respectively, include a substrate 10, a member 20 to be encapsulated (hereinafter referred to as "the member 20") disposed on the substrate 10, and a laminated layer 30 used for the member 20. The laminated layer 30 includes an inorganic layer 310 and an organic layer 320 alternately stacked. In an embodiment of the present disclosure, the outermost layer of the laminated layer 30 is an inorganic layer 310. The organic layer 320 has an inner surface 321 facing the member 20, an outer surface 322 opposite to the inner surface, and an end surface 323 located between the inner surface 321 and the outer surface 322 and extending over a region, at a periphery of the member 20, of the substrate. In addition, the thin film encapsulation structures 200a and 200b further include a restriction layer 330 for positioning the organic layer 320 between the end surface 323 and a surface of the substrate 10. The organic layer 320 may have one of hydrophilicity and hydrophobicity, and the restriction layer 330 may have the other of hydrophilicity and hydrophobicity.

In the exemplary embodiment of the present disclosure, FIGS. 2A and 3A (described later) show a case where the layer closest to the member 20 of the laminated layer 30 is the organic layer 320, and FIGS. 2B and 3B (described later) show a case where the layer closest to the member 20 of the laminated layer 30 is the inorganic layer 310.

In an exemplary embodiment of the present disclosure, on one hand, the organic layer 320 may have hydrophilicity, and the restriction layer 330 may have hydrophobicity. As an example, a material of the organic layer 320 may include epoxy resin, acryl, polyacrylate, polydimethyl diphenyl ether, polypropylene, or a combination thereof.

In an exemplary embodiment of the present disclosure, on the other hand, the organic layer 320 may have hydrophobicity, and the restriction layer 330 may have hydrophilicity. As an example, a material of the organic layer 320 may include polyimide, polyethyleneimine, or a combination thereof, and a material of the restriction layer 330 may include $Al_2O_3$.

In an exemplary embodiment of the present disclosure, the organic layer 320 has a thickness of about 3 to 15 μm, the restriction layer 330 has a thickness of about 50 to 800 Å, and the restriction layer 330 has a width of about 100 to 500 μm.

Figure 3A:
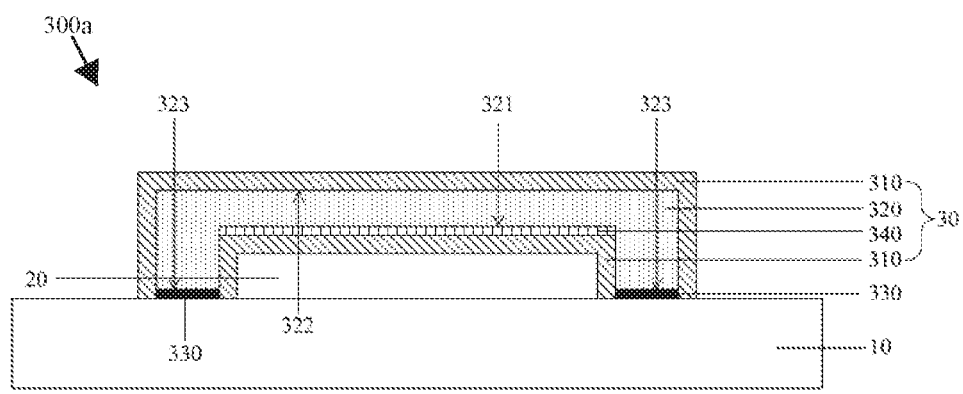
FIG. 3A is a schematic view showing a cross section of a thin film encapsulation structure according to an embodiment of the present disclosure.
Figure 3B:
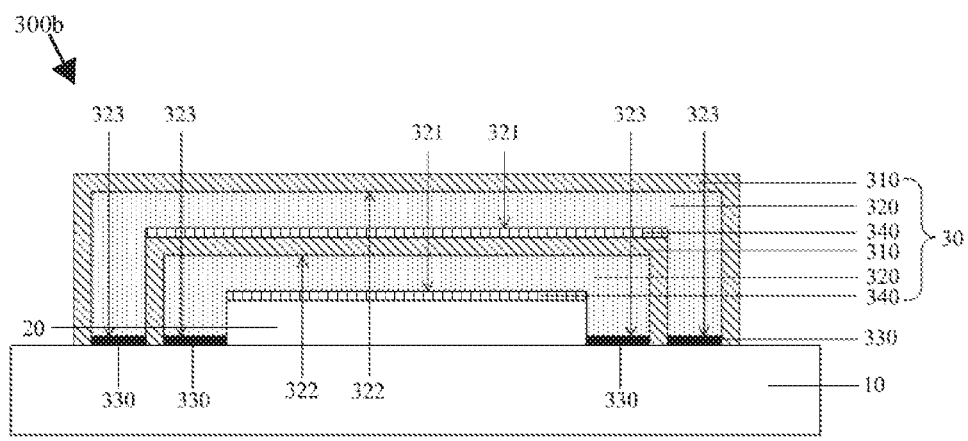
FIG. 3B is a schematic view showing a cross section of a thin film encapsulation structure according to an embodiment of the present disclosure.

In addition, FIG. 3A is a schematic view showing a cross section of a thin film encapsulation structure 300a according to an embodiment of the present disclosure, and FIG. 3B is a schematic view showing a cross section of a thin film encapsulation structure 300b according to an embodiment of the present disclosure.

As shown in FIGS. 3A and 3B, in an exemplary embodiment of the present disclosure, the thin film encapsulation structure laminated layer 30 may further include an auxiliary extension layer 340 located on a portion, extending along a direction parallel to the surface of the substrate 10, of the inner surface 321 of the organic layer 320. The auxiliary extension layer 340 and the organic layer 320 have hydrophilicity or hydrophobicity.

In an exemplary embodiment of the present disclosure, on the one hand, when the organic layer 320 has hydrophilicity, the auxiliary extension layer 340 has hydrophilicity. As an example, a material of the auxiliary extension layer 340 may include $Al_2O_3$.

In an exemplary embodiment of the present disclosure, on the other hand, when the organic layer 320 has hydrophobicity, the auxiliary extension layer 340 has hydrophobicity.

In an exemplary embodiment of the present disclosure, the auxiliary extension layer 340 has a thickness of about 50 to 800 Å.

In an exemplary embodiment of the present disclosure, the inorganic layer 310 may include a ceramic material. As an example, the ceramic material may include $SiO_2$, $SiN_x$, $SiO_xN_y$, $Al_2O_3$, or a combination thereof, and the inorganic layer 310 has a thickness of about 0.5 to 1 μm.

It should be noted that a projection of the auxiliary extension layer 340 on the substrate 10 may overlap with a projection of the member 20 on the substrate.

In an exemplary embodiment of the present disclosure, the inorganic layer 310 is configured to block moisture and oxygen in the environment, and the organic layer 320 is used as a planarization layer. It will be appreciated that the laminated layer 30 can include a plurality of inorganic layers 310 and organic layers 320 alternately stacked. As a result, moisture and oxygen in the environment can be better blocked to better protect the encapsulated members.

In an exemplary embodiment of the present disclosure, the member 20 may include an OLED display device.

In an embodiment of the present disclosure, a method of a thin film encapsulation structure is also provided, which is capable of manufacturing a thin film encapsulation structure including a restriction layer, thereby implementing a narrow frame encapsulation.

Figure 4:
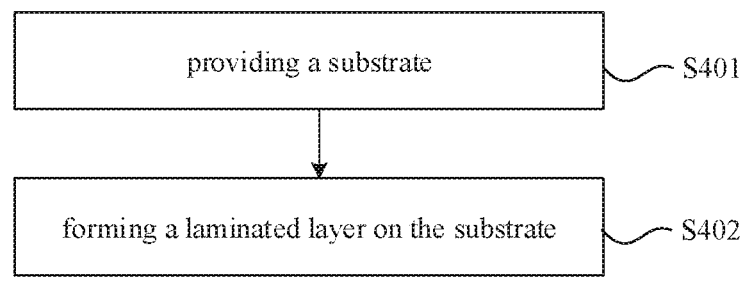
FIG. 4 is a flow chart schematically showing a method for manufacturing a thin film encapsulation structure according to an embodiment of the present disclosure.
Figure 5:
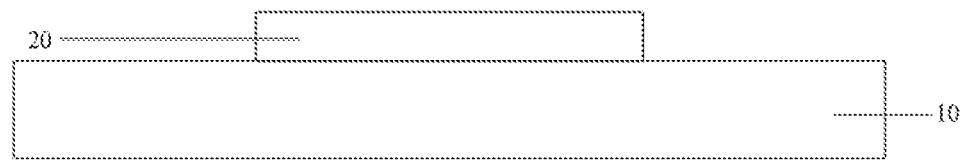
FIG. 5 is a schematic view showing forming of a substrate in a method for manufacturing a thin film encapsulation structure according to an embodiment of the present disclosure.

FIG. 4 is a flow chart schematically showing a method for manufacturing a thin film encapsulation structure according to an embodiment of the present disclosure. As shown in FIG. 4, in step S401, a substrate is provided. FIG. 5 is a schematic view showing formation of a substrate 10 in a method for manufacturing a thin film encapsulation structure according to an embodiment of the present disclosure. As shown in FIG. 5, a substrate 10 is provided. A member 20 to be encapsulated (hereinafter referred to as "the member 20") is disposed on a surface of the substrate 10.

As shown in FIG. 4, in step S402, a laminated layer is formed on the substrate. Specifically, a laminated layer 30 for encapsulating the member 20 is formed on substrate 10 and the member 20 to form the thin film encapsulation structures 200a and 200b as shown in FIGS. 2A and 2B. In an embodiment of the present disclosure, the laminated layer 30 includes an inorganic layer 310 and an organic layer 320 alternately stacked, wherein the outermost layer of the laminated layer 30 is the inorganic layer 310. The organic layer 320 has an inner surface 321 facing the member 20, an outer surface 322 opposite to the inner surface, and an end surface 323 located between the inner surface 321 and the outer surface 322 and extending over a region, at a periphery of the member 20, of the substrate.

In an embodiment of the present disclosure, forming the laminated layer 30 further includes forming a restriction layer 330 for positioning the organic layer 320 on the surface, where the organic layer 320 is to be formed, of the substrate 10. The organic layer 320 may have one of hydrophilicity and hydrophobicity, and the restriction layer 330 may have the other of hydrophilicity and hydrophobicity.

Figure 6A:
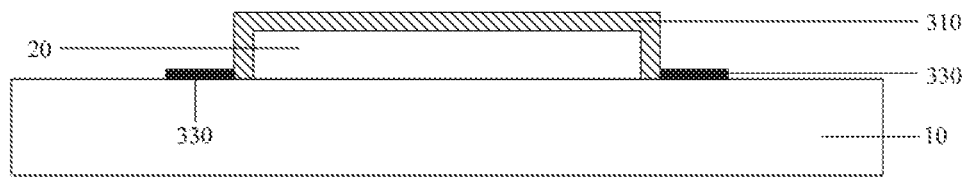
FIGS. 6A-6C are schematic views showing formation a restriction layer in a method for manufacturing a thin film encapsulation structure according to an embodiment of the present disclosure.
Figure 6B:
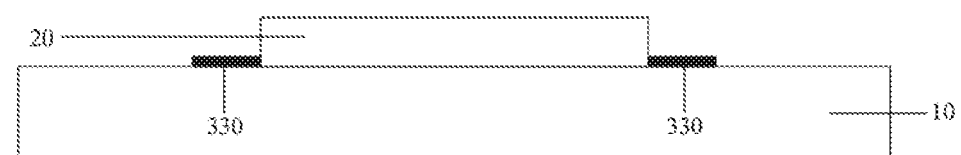
Figure 6C:
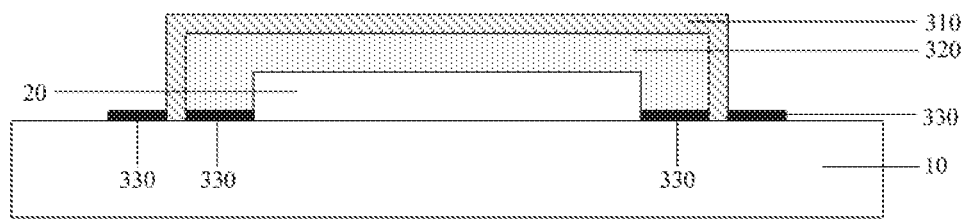

FIGS. 6A-6C are schematic views showing formation of a restriction layer in a method for manufacturing a thin film encapsulation structure according to an embodiment of the present disclosure.

As shown in FIG. 6A, a restriction layer 330 for positioning the organic layer 320 is formed on the surface, where the organic layer 320 is to be formed, of the substrate 10. Thus, the thin film encapsulation structure 200a as shown in FIG. 2A may be finally obtained.

As shown in FIGS. 6B and 6C, a restriction layer 330 for positioning the organic layer 320 is formed on the surface, where the organic layer 320 is to be formed, of the substrate 10. Thus, the thin film encapsulation structure 200b as shown in FIG. 2B may be finally obtained.

In an exemplary embodiment of the present disclosure, forming the laminated layer 30 further includes forming an auxiliary extension layer 340 on a surface, on which the organic layer 320 is to be formed, of the member 20 or the inorganic layer 310 before forming the organic layer 320. The auxiliary extension layer 340 and the organic layer 320 both have hydrophilicity or hydrophobicity. The resulting thin film encapsulation structure is shown as the thin film encapsulation structures 300a and 300b in FIGS. 3A and 3B.

Figure 7A:
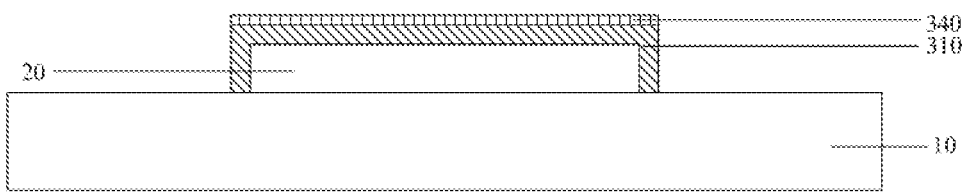
FIGS. 7A-7C are schematic views showing formation of an auxiliary extension layer in a method for manufacturing a thin film encapsulation structure according to an embodiment of the present disclosure.
Figure 7B:
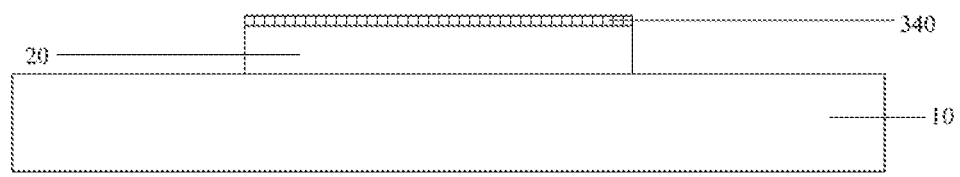
Figure 7C:
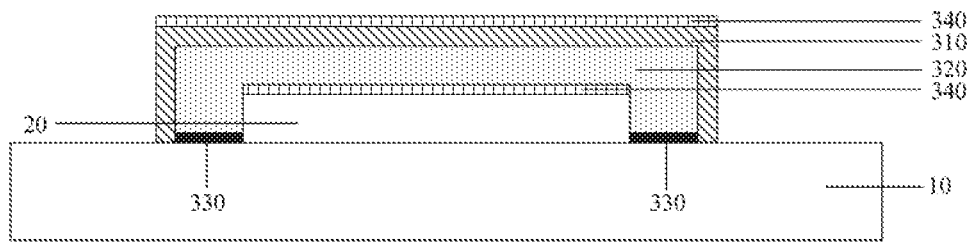

FIGS. 7A-7C are schematic views showing formation of an auxiliary extension layer in a method for manufacturing a thin film encapsulation structure according to an embodiment of the present disclosure.

As shown in FIG. 7A, an auxiliary extension layer 340 is formed on the surface of the inorganic layer 310, thereby the structure 300a as shown in FIG. 3A may be finally obtained.

As shown in FIGS. 7B and 7C, after an auxiliary extension layer 340 is formed on the surface of the member 20 and the organic layer 320 and the inorganic layer 310 alternately stacked are formed, another auxiliary extension layer 340 is formed on a surface of the inorganic layer 310, thereby the thin film encapsulation structure 300b as shown in FIG. 3B may be finally obtained.

It should be noted that a projection of the auxiliary extension layer 340 on the substrate 10 may overlap with a projection of the member 20 on the substrate.

In an exemplary embodiment of the present disclosure, on one hand, when the organic layer 320 may have hydrophilicity, the restriction layer 330 may have hydrophobicity, and the auxiliary extension layer 340 may have hydrophilicity. As an example, a material of the organic layer 320 may include epoxy resin, acryl, polyacrylate, polydimethyl diphenyl ether, polypropylene, or a combination thereof, and a material of the auxiliary extension layer 340 may include $Al_2O_3$. As an example, the alkali metal salt may include LiF, $MgCl_2$, NaCl, or a combination thereof, and the alkaline earth metal oxide may include CaO.

In an exemplary embodiment of the present disclosure, on the other hand, when the organic layer 320 may have hydrophobicity, the restriction layer 330 may have hydrophilicity, and the auxiliary extension layer 340 may have hydrophobicity. As an example, a material of the organic layer 320 may include polyimide, polyethyleneimine, or a combination thereof, and a material of the restriction layer 330 may include $Al_2O_3$. As an example, the alkali metal salt may include LiF, $MgCl_2$, NaCl, or a combination thereof, and the alkaline earth metal oxide may include CaO.

In an exemplary embodiment of the present disclosure, the method for forming the organic layer 320, the restriction layer 330, and the inorganic layer 310 includes inkjet printing, chemical vapor deposition, screen printing, evaporation, sputtering, or atomic layer deposition.

For example, regarding the formation of the hydrophilic restriction layer 330 or the hydrophilic auxiliary extension layer 340, specifically, an $Al_2O_3$ film may be formed by a sputtering method or an atomic layer deposition method, and then the structure in which the $Al_2O_3$ film is formed is immersed in a tetraethyl orthosilicate-ethanol solution for 2 to 5 minutes to obtain the restriction layer 330 or the auxiliary extension layer 340. The restriction layer 330 or the auxiliary extension layer 340 including the polytetrafluoroethylene may be obtained by a sputtering method. The restriction layer 330 or the auxiliary extension layer 340 including polydimethylsiloxane may be obtained by an evaporation method, inkjet printing, or screen printing.

In an exemplary embodiment of the present disclosure, the inorganic layer 310 is configured to block moisture and oxygen in the environment, and the organic layer 320 is used as a planarization layer. The drawings of the disclosure are merely exemplary. It will be appreciated that a laminated layer 30 including a plurality of the inorganic layers 310 and the organic layers 320 alternately stacked may be formed. As a result, moisture and oxygen in the environment may be better blocked to better protect the encapsulated member.

In the embodiment of the present disclosure, the thin film encapsulation structure includes a restriction layer at the periphery of the member to be encapsulated. Since the organic layer has one of hydrophilicity and hydrophobicity, and the restriction layer has the other of hydrophilicity and hydrophobicity, the organic layer may be restricted in the designed region by the restriction layer, thereby preventing the organic layer from spreading towards the edge of the substrate, and enabling a narrow frame encapsulation. In addition, the thin film encapsulation structure may further include an auxiliary extension layer on an inner surface of the organic layer facing the member to be encapsulated, which contributes to uniformity of the organic layer and avoids formation of folds of the organic layer, thereby reducing uneven brightness when the encapsulated display device displays and improving the display effect of the display device.

The foregoing description of the embodiments has been provided for purpose of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are included within the scope of the disclosure.

What is claimed is:

1. A thin film encapsulation structure comprising:
a laminated layer for encapsulating a member to be encapsulated located on a substrate, the laminated layer comprising an organic layer and an inorganic layer alternately stacked, wherein an outermost layer of the laminated layer is the inorganic layer, the organic layer having an inner surface facing the member, an outer surface opposite to the inner surface, and an end surface located between and connecting the inner surface and the outer surface and extending over a region, at a periphery of the member, of the substrate; and
a restriction layer, for positioning the organic layer, located between the end surface of the organic layer and a surface of the substrate, wherein the organic layer has one of hydrophilicity and hydrophobicity, wherein the restriction layer has the other of hydrophilicity and hydrophobicity, and wherein a layer closest to the member of the laminated layer is the organic layer,
wherein the member to be encapsulated comprises an OLED display device,
wherein the restriction layer has a bottom surface facing the substrate, a top surface opposite to the bottom surface, and a side surface located between the bottom surface and the top surface, the bottom surface and the top surface being parallel to the substrate, and the end surface of the organic layer, as a whole, contacting the top surface of the restriction layer,
wherein the organic layer is completely spaced apart from the substrate by the member to be encapsulated and the restriction layer,
wherein the restriction layer, as a whole, is only located between the end surface of the organic layer and the substrate, and wherein an orthographic projection of the restriction layer on the substrate does not overlap with an orthographic projection of the member to be encapsulated on the substrate,
wherein the inorganic layer has an inner surface facing the organic layer, an outer surface opposite to the inner surface, and an end surface located between and connecting the inner surface and the outer surface and extending over a region, at a periphery of the organic layer, of the substrate, and
wherein the end surface of the inorganic layer, the bottom surface of the restriction layer, and a bottom surface of the member to be encapsulated are coplanar with each other.

2. The thin film encapsulation structure according to claim 1,
wherein the organic layer has hydrophilicity and the restriction layer has hydrophobicity.

3. The thin film encapsulation structure according to claim 2, wherein a material of the organic layer comprises at least one of epoxy resin, acryl, polyacrylate, polydimethyl diphenyl ether, and polypropylene.

4. The thin film encapsulation structure according to claim 1,
wherein the organic layer has hydrophobicity and the restriction layer has hydrophilicity.

5. The thin film encapsulation structure according to claim 4, wherein a material of the organic layer comprises at least one of polyimide and polyethyleneimine, and wherein a material of the restriction layer comprises $Al_2O_3$.

6. The thin film encapsulation structure according to claim 1, wherein the restriction layer has a thickness of about 50 to 800 Å, and wherein the restriction layer has a width of about 100 to 500 µm.

7. The thin film encapsulation structure according to claim 1, wherein the laminated layer further comprises an auxiliary extension layer on a portion, extending along a direction parallel to a surface of the substrate, of the inner surface of the organic layer, and wherein the auxiliary extension layer and the organic layer have one of hydrophilicity and hydrophobicity.

8. The thin film encapsulation structure according to claim 7, wherein the auxiliary extension layer and the organic layer have hydrophilicity.

9. The thin film encapsulation structure according to claim 8, wherein a material of the auxiliary extension layer comprises $Al_2O_3$.

10. The thin film encapsulation structure according to claim 7, wherein the auxiliary extension layer and the organic layer have hydrophobicity.

11. The thin film encapsulation structure according to claim 7, wherein the auxiliary extension layer has a thickness of about 50 to 800 Å.

12. The thin film encapsulation structure according to claim 1, wherein the inorganic layer comprises a ceramic material.

13. The thin film encapsulation structure according to claim 12, wherein the ceramic material comprises at least one of $SiO_2$, $SiN_x$, $SiO_xN_y$, and $Al_2O_3$.

14. A method for manufacturing a thin film encapsulation structure, the method comprising:
providing a substrate, wherein a surface of the substrate is provided with a member to be encapsulated; and
forming a laminated layer, for encapsulating the member, on the substrate and the member, the laminated layer comprising an organic layer and an inorganic layer alternately stacked, wherein an outermost layer of the laminated layer is the inorganic layer,
wherein forming the laminated layer further comprises forming a restriction layer for positioning the organic layer on a surface, on which the organic layer is to be formed, of the substrate, the organic layer has one of hydrophilicity and hydrophobicity and the restriction layer has the other of hydrophilicity and hydrophobicity,
wherein a layer closest to the member of the laminated layer is the organic layer, the organic layer having an inner surface facing the member, an outer surface opposite to the inner surface, and an end surface located between and connecting the inner surface and the outer surface and extending over a region, at a periphery of the member, of the substrate,
wherein the restriction layer is located between the end surface of the organic layer and the surface of the substrate,
wherein the member to be encapsulated comprises an OLED display device,
wherein the restriction layer has a bottom surface facing the substrate, a top surface opposite to the bottom surface, and a side surface located between the bottom surface and the top surface, the bottom surface and the top surface being parallel to the substrate, and the end surface of the organic layer, as a whole, contacting the top surface of the restriction layer,
wherein the organic layer is completely spaced apart from the substrate by the member to be encapsulated and the restriction layer,
wherein the restriction layer, as a whole, is only located between the end surface of the organic layer and the substrate, and wherein an orthographic projection of the restriction layer on the substrate does not overlap with an orthographic projection of the member to be encapsulated on the substrate,
wherein the inorganic layer has an inner surface facing the organic layer, an outer surface opposite to the inner surface, and an end surface located between and connecting the inner surface and the outer surface and extending over a region, at a periphery of the organic layer, of the substrate, and
wherein the end surface of the inorganic layer, the bottom surface of the restriction layer, and a bottom surface of the member to be encapsulated are coplanar with each other.

15. The method according to claim 14, wherein forming the laminated layer further comprises forming an auxiliary extension layer on a surface, on which the organic layer is to be formed, of the member or the inorganic layer before forming the organic layer, and wherein the auxiliary extension layer and the organic layer have one of hydrophilicity and hydrophobicity.

* * * * *